United States Patent
Shrivastava et al.

(10) Patent No.: US 7,154,175 B2
(45) Date of Patent: Dec. 26, 2006

(54) GROUND PLANE FOR INTEGRATED CIRCUIT PACKAGE

(75) Inventors: Udy A. Shrivastava, Tempe, AZ (US); Kristopher Frutschy, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 120 days.

(21) Appl. No.: 10/873,817

(22) Filed: Jun. 21, 2004

(65) Prior Publication Data

US 2005/0280138 A1 Dec. 22, 2005

(51) Int. Cl.
  *H01L 23/34* (2006.01)
(52) U.S. Cl. .................................... 257/723
(58) Field of Classification Search .............. 257/723
  See application file for complete search history.

(56) References Cited

U.S. PATENT DOCUMENTS

| 6,600,222 B1* | 7/2003 | Levardo ................. 257/686 |
| 8,600,222 | 7/2003 | Levardo |
| 2003/0232519 A1 | 12/2003 | Chien |
| 2005/0012194 A1* | 1/2005 | Jaeck .................... 257/686 |

* cited by examiner

*Primary Examiner*—Roy Potter
(74) *Attorney, Agent, or Firm*—Schwabe, Williamson & Wyatt, P.C.

(57) ABSTRACT

An integrated circuit package includes a first chip and a folded flexible substrate. The flexible substrate has a first surface and an opposing second surface and is disposed to partially surround the first chip. A first routing layer is formed on the first surface of the flexible substrate and a second routing layer is formed on the second surface of the flexible substrate. A metal ground plane is formed on a selected one of the first and the second surfaces.

19 Claims, 3 Drawing Sheets

GROUND PLANE FOR INTEGRATED CIRCUIT PACKAGE

BACKGROUND OF THE INVENTION

1. Field of the Invention

The present invention relates to electronic devices, and in particular, to packages for electronic devices.

2. Description of Related Art

An IC package typically includes a substrate or chip carrier and one or more chips. In ball-grid arrays (BGA), solder balls are used to connect the IC package to a printed circuit board (PCB). The die or chip within the IC package may use wire bonding, flip-chip technology or tape automated bonding (TAB) to connect the chip to the substrate. A land grid array (LGA) package is essentially the same as a BGA package, except the solder balls are removed. In a chip scale package (CSP), the goal is to achieve a package area no larger than the die itself.

In a folded and stacked BGA (FSBGA) package, multiple chips may be included. The FSBGA package may use two-layer wiring wherein a folded, flexible, polymer substrate has on one surface a first routing layer with metal attachment pads, on the other surface a second routing layer with metal interconnects for interconnecting with the attachment pads, and vias interconnecting the two routing layers. In some designs, the folded flexible tape has a U-shaped configuration which surrounds one or more chips and allows for one or more additional chips to be staked on top of the folded flexible tape to create a multi-chip IC package. This FSBGA package may also be referred to as a folded and stacked CSP (FSCSP) package.

Referring to FIG. 1, a segment 10 of an interconnect routing layer of a FSBGA package is shown. With this FSBGA package, high-speed signals in conductive signal traces 12 need return ground traces 14 that are as close as possible to signal traces 12. As input/output (I/O) speed increases from 66 megahertz (MHz) to 133 MHz, the number of ground traces 14 required may be doubled. Beyond 133 MHz, this number may double again, requiring finer trace lines and vias for the routing. Hence, to deal with increasing I/O speeds in IC packages, the conventional practice is to increase the number of ground traces and reduce the line widths and spacing for the interconnects. In FIG. 1, signal traces 12, ground traces 14, and power traces 16 have a 2:1:1 ratio, requiring 50% of the available routing on the interconnect routing layer to be for power and ground traces 16 and 14.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Beyond 150 MHz or 300 mega transactions per second (MT/s), FSBGA packages may require a metal layer to serve as the ground plane to manage signal integrity and electromagnetic interference (EMI) performance. One option may be to add a third metal layer in the middle of two routing layers of a folded flexible tape. In taking a different approach, an IC package, according to one embodiment of the present invention, utilizes a metal fill in one of its routing surfaces of a folded flexible substrate as a ground or reference plane. The area used for the ground plane is an area that would not otherwise be used for routing. In one embodiment, an area of a pad routing layer that would otherwise be unused may be used as a ground plane. In one embodiment, by filling the exposed outer surface of the folded flexible substrate with the metal sheet for form the ground plane, switching noise, crosstalk noise and unintentional radiation may be significantly reduced. In one embodiment, the IC package may be an FSBGA package. The FSBGA package may enable integration of other components on top of the package. In this manner, a multi-chip package may be made by stacking multiple components.

Figure 3:
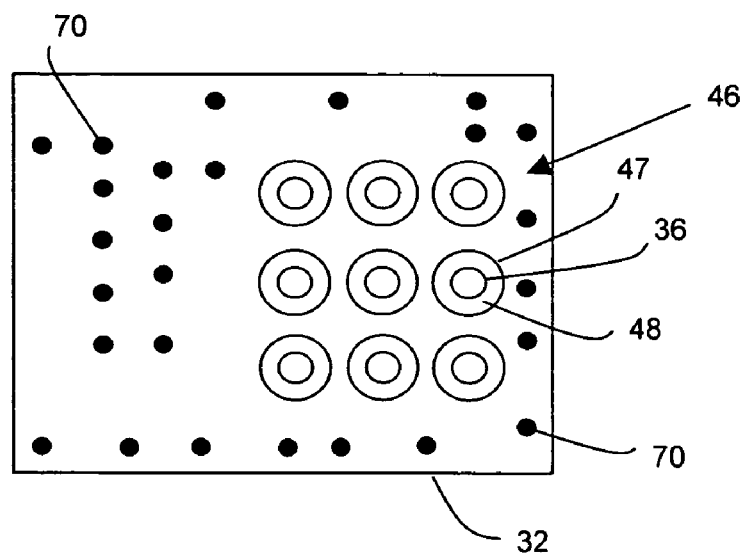
FIG. 3 is a generalized view of a routing layer of a folded, flexible tape of the IC package of FIG. 2 according to one embodiment of the present invention.
Figure 2:
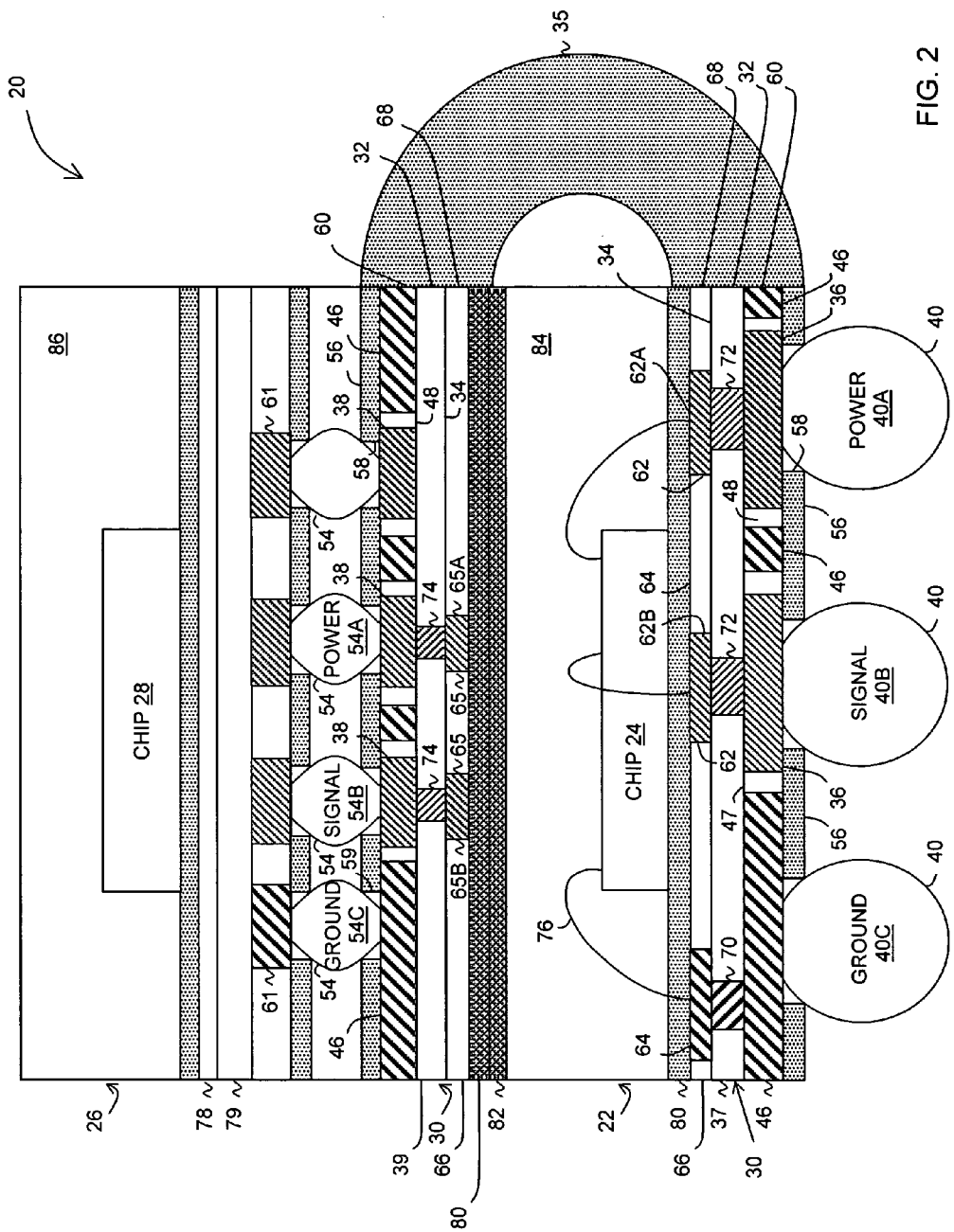
FIG. 2 is a cross-sectional view of an IC package according to one embodiment of the present invention.

Referring to FIGS. 2 and 3, an IC package 20, according to one embodiment of the present invention, is shown. As previously mentioned, in one embodiment, the IC package 20 may be a FSBGA package. The IC package 20 may include a first module 22 with a first chip or die 24. The IC package 20 may further include a second module 26 with a second chip 28 or may be used as a stand-alone package with just the first module 22. The modules 22 and 26 may contain more than one chip, but for the purposes of illustration only one chip is shown in each module. The first module 22 has a folded flexible substrate 30 which may be folded over to define a U-shape configuration about the first chip 24. The flexible substrate 30 has a first surface 32 and a second surface 34, with the first surface 32 being outwardly disposed relative to the first chip 24 and the second surface 34 being inwardly disposed relative to the first chip 24. With reference to FIG. 2, although the various layers are not shown in a curved portion 35 of the flexible substrate 30, they are continuous through this curved portion 35. The flexible substrate 30 may be made of a polymeric material, such as polyimide. The IC package 20 has paths for input/output (I/O) signals, power and ground extending from the first and second chips 24 and 28 to the PCB, as will be described hereinafter.

The first surface 32 of the flexible substrate 30 may have a first array of attachment pads 36 located on a first end portion 37 of the flexible substrate 30 and a second array of attachment pads 38 located on a second end portion 39 of the flexible substrate. A first array of corresponding solder balls 40, forming a ball grid array (BGA), may be disposed on the bottom of the first module 22 to engage the first array of attachment pads 36. Part of these attachment pads 36 and corresponding solder balls 40 may be for power paths, as illustrated by the power solder ball 40A. Part of these attachment pads 36 and corresponding solder balls 40 may be for signal paths, as illustrated by the signal solder ball 40B. In summary, the flexible substrate 30 is defined to have the first and second portions 37 and 39 joined by the centrally located, curved portion 35, with the opposed first and second surfaces 32 and 34 extending continuously through all three portions 37, 35 and 39. In any alternative embodiment, the solder balls 40 may be eliminated, and the attachments pads 36 may engage contacts of a LGA socket interposed between the IC package 20 and the PCB.

As previously mentioned, the portion of the first surface 32 which is not occupied the attachment pads 36 has deposited thereon a ground plane 46, as best shown by the hatched area in FIG. 3. In other words, the ground plane 46 makes use of the surface area of the first surface 32 that otherwise would be unused. The ground plane 46 is spaced-apart from the attachment pads 36 by a plurality of insulating areas 47 filled with an insulating material 48, with one of the insulating areas 47 surrounding each of the attachment pads 36 so as to avoid electrical shorts. As shown in FIG. 2, some of the solder balls 40 in the ground paths engage the ground plane 46, as illustrated by the ground solder ball 40C. For the ground paths, the ground plane serves as the attachment pad for the solder balls. Hence, on the first surface 32, there are no separate attachment pads for the ground solder balls 40C.

The second array of attachment pads 38 located on the second end portion 39 of the first surface 32 may be arranged to engage a second array of solder balls 54. The solder balls 54 are disposed in a BGA array to engage the attachment pads 38 and the ground plane 46. The power, signal, and ground paths are shown by the illustrative solder balls 54A, 54B, and 54C, respectively. The illustrative ground solder ball 54C is not coupled to an attachment pad, but is coupled to the ground plane 46. Hence, the ground balls 40C and 54C are coupled to the same continuous ground plane 46. The first surface 32 may include a solder mask 56 with a plurality of holes 58 and 59 to expose the attachment pads 36 and 38, respectively. In the illustrative embodiment, a first routing layer 60 is formed by the attachment pads 36 and 38 and the insulating material 48 in between the pads. The pads 36 and 38 may be made of metal deposited on the first surface 32 of the flexible substrate 30. In this embodiment, for routing purposes, only attachment pads and the ground plane 46 are on the first routing layer 60; hence, it may be referred to as a pad layer. The solder balls 40 may be disposed to engage an array of attachment pads on the PCB (not shown). The solder balls 54 are disposed to engage an array of attachment pads 61 of the second module 26. In other embodiments, some conductive traces may be on this first routing layer 60.

With reference to FIG. 2, in the first end portion 37 of the flexible substrate 30, the second surface 34 may have deposited thereon a plurality of spaced-apart, conductive traces 62 terminating in attachment pads (not shown) for attachments to the chip 24. In this embodiment, such conductive traces 62 may be power traces 62A and signal traces 62B. Unlike the prior art, no ground traces are needed, due to the presence of the ground plane 46 in the first routing layer 60. Hence, there are ground pads 64 and not ground traces on the first end portion 37. In the second end portion 39 of the flexible substrate 30, the second surface 34 may have deposited thereon a plurality of spaced-apart, conductive traces 65, which will be connected to the solder balls 40 by way of vias and pads, as will be described hereinafter. In this embodiment, such conductive traces 65 may be power traces 65A and signal traces 65B. Unlike the prior art, no ground traces are needed, due to the presence of the ground plane 46 in the first routing layer 60. The ground pads 64 and the conductive traces 62 and 65 and their associated attachment pads, along with an insulating material 66 used to fill between traces and pads, form a second routing layer 68. In summary, the flexible substrate 30 has deposited on its opposed first and second surfaces 32 and 34 the first and second routing layers 60 and 68, respectively.

The two routing layers 60 and 68 may be connected by vias that extend through and traverse the flexible substrate 30. More specifically, a first plurality of vias 70 traverse the first end portion 37 of the flexible substrate 30 to connect the ground pads 64 to the ground plane 46. A second plurality of vias 72 traverse the first end portion 37 of the flexible substrate 30 to connect the conductive traces 62 to the pads 36. A third plurality of vias 74 traverse the second end portion 39 of the flexible substrate 30 to connect the conductive traces 65 to the pads 38.

Wire bonding, flip-chip technology or tape automated bonding (TAB) may be used for the substrate-to-chip connections for the chips 24 and 28. As an example, for the first module 22, bonding wires 76 are shown for connecting a plurality of chip pads (not shown) on a surface of the chip 24 to a plurality of attachment pads (not shown) at the end of conductive traces 72 and to the ground pads 64. Conductive traces (not shown) in a routing layer 78 of the second module 26 (on top of a mold layer 79) may likewise be coupled to the chip 28. Additional chips 28 may be staked on top of the illustrated chip 28 and connected with wire bonding in the same manner as the illustrated chip 28. The conductive traces 62 and 65, the pads 36 and 38 may be made of metals, such as copper (preferred), aluminum, silver, gold, alloys thereof, and the like, but may also be formed from conductive polymers, such as copper-filled epoxies and the like. The chips 24 and 28 may include an active device such as a microprocessor, a chipset, a memory device, an ASIC, and the like, and/or passive devices, such as resistors, capacitors, and the like. The chips 24 and 28 may be coupled to the first and second modules 22 and 26 by a first and second adhesive layer 80 and 82, respectively, made of epoxies, urethane, polyurethane, and silicone elastomers and the like. The chips 24 and 28 may be partially encapsulated in a first and a second mold layer 84 and 86, respectively. The layers 84 and 86 may be formed to plastics, resins, epoxies, and the like.

As previously mentioned, the ground plane 46 is made of a thin layer of metal, such as copper. It may be deposited on the first surface 32 using electroplating. Mechanical forming of the IC package 20 may not be reduced by adding a thin plane of copper on the first surface 32 of the flexible substrate 30 to form the ground plane 46. A radius of curvature of 0.4 mm should be possible with the flexible substrate 30 using the following assumptions: total package thickness=0.8 mm, copper plane 46 thickness<0.1 mm, copper ductility=50%, min. radius=(package thickness)/(4 (max. ductility)).

Figure 1:
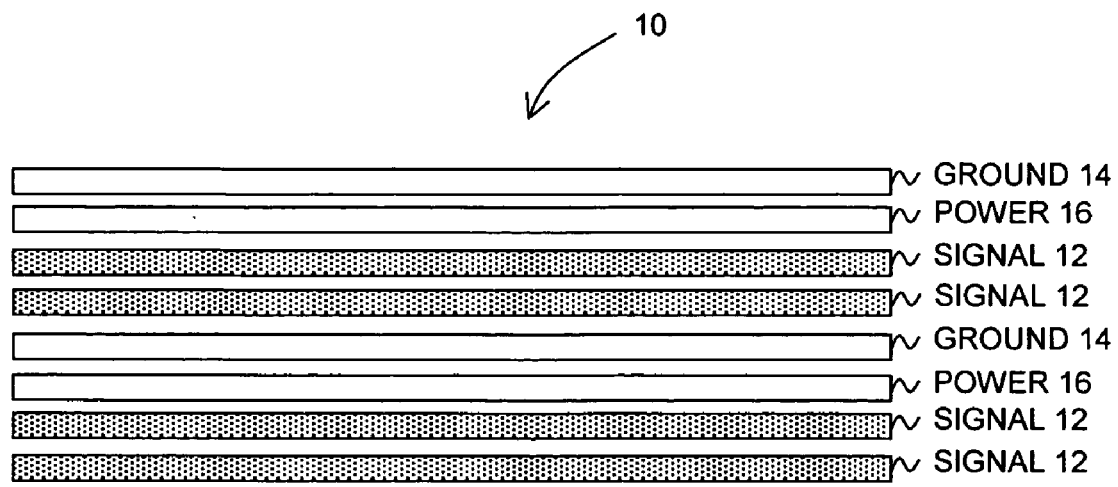
FIG. 1 is a fragmented view of a segment of an interconnect routing layer of a conventional FSBGA package.

Thus, the first module 22 may be shrouded by the metal layer of the ground plane 46. As a result, the impedance of the interconnects may become more uniform, switching and crosstalk noise may be reduced, and electromagnetic radiation may be reduced. By providing the ground plane on the previously unused area of the first surface 32 of the flexible substrate 30, only 12% of the routing layer may be needed for power distribution instead of the approximate 50% of the prior art method of FIG. 1. In other words, the second routing layer 68 may have signal paths (traces) and power paths (traces) in the ratio of 8:1. Similar performance of the prior art may require 2:1:1 routing for signal, power and ground, as shown in FIG. 1. This scheme may extend the capability of the package 20 to 333–400 MT/s. Reliability and cost of the two metal layer FSBGA package 20 may be better than a three metal layer FSBGA package, with the third metal layer being for the ground plane.

In another embodiment (not shown), the folded flexible substrate may have a plurality of polymer layers so as to allow three or more routing layers. Two routing layers may be deposited on a first and a second surface of the flexible substrate with attachment pads for a PCB and a chip, respectively. One or more routing layers may be formed within the flexible substrate 30 so as to provide internal routing with conductive traces connected by vias to the attachment pads on the outer routing layers. In one embodiment, the outwardly facing first surface may have deposited thereon the ground plane. The inwardly facing second surface also may include the ground plane instead of or in addition to the outwardly facing first surface; however, in the first case this implementation may not provide as effective shielding for the traces from external EMI.

Figure 4:
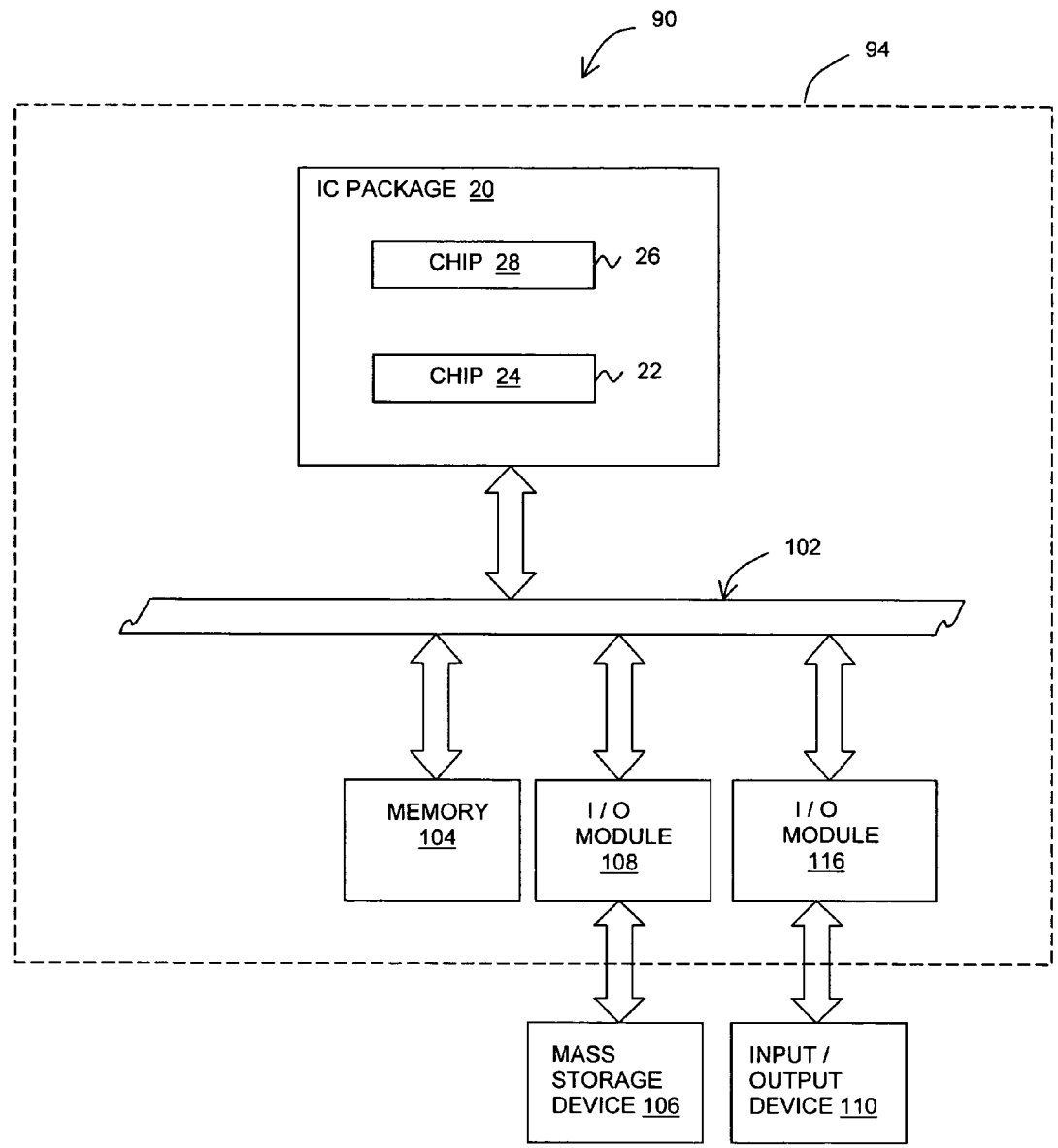
FIG. 4 is a system incorporating the IC package of FIGS. 2 and 3 according to one embodiment of the present invention.

Referring to FIG. 4, there is illustrated a system 90, which is one of many possible systems in which the IC package 20 of FIGS. 2 and 3 may be used. In the system 90 an IC package 20 may be mounted on a substrate or printed circuit board (PCB) 94. The first chip 24 of the first module 22 may be a processor chip and the PCB 94 may be a motherboard. The second module 26 may include a plurality of stacked chips 28 including a graphics controller for a displace device (not shown), a flash memory chip and/or a synchronous dynamic random access memory (SDRAM) chip. The IC package 20 may be coupled to a bus system 102.

Additionally, the PCB 94 may have mounted thereon additional main memory 104 and a plurality of additional input/output (I/O) modules for external devices or external buses, all coupled to each other by the bus system 102. The system 90 may further include a mass storage device 106 coupled to the bus system 102 via an I/O module 108. Another I/O device 110 may be coupled to the bus system 102 via an I/O module 112. Additional I/O modules may be included for other external or peripheral devices or external buses.

Examples of the main memory 104 include, but are not limited to, static random access memory (SRAM) and dynamic random access memory (DRAM). The memory 104 may include an additional cache memory. Examples of the mass storage device 106 include, but are not limited to, a hard disk drive, a compact disk drive (CD), a digital versatile disk driver (DVD), a floppy diskette, a tape system and so forth. Examples of the input/output devices 110 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 94. Examples of the bus system 102 include, but are not limited to, a peripheral control interface (PCI) bus, and Industry Standard Architecture (ISA) bus, and so forth. The bus system 102 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 90. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the first chip 24 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
a first chip;
a folded flexible substrate, having a first surface and an opposing second surface, disposed to partially surround the first chip, with the first surface being disposed outwardly relative to the first chip and the second surface being disposed inwardly relative to the first chip;
a first routing layer formed on the first surface and a second routing layer formed on the second surface; and
a metal ground plane disposed on the first surface and forms part of the first routing layer.

2. The apparatus according to claim 1, wherein the first routing layer includes a plurality of attachment pads formed on the first surface; and the ground plane is disposed in a surrounding spaced-apart relationship to the attachment pads.

3. The apparatus according to claim 1, wherein the first routing layer includes a plurality of attachment pads formed on the first surface; and the ground plane extends over substantially most of the first surface not occupied by the plurality of attachment pads and a plurality of insulating areas surrounding the attachment pads.

4. The apparatus according to claim 2, wherein the second routing layer includes a plurality of ground pads electrically coupled to the first chip, a plurality of power traces electrically coupled to the first chip, and a plurality of signal traces electrically coupled to the first chip.

5. The apparatus according to claim 2, wherein the flexible substrate includes a first end portion; a second end portion; and a curved portion connecting the first and the second end portions; the first and second surfaces extending through the first end portion, the curved portion and the second end portion; the first surface in the first end portion having deposited thereon a first array of attachment pads; and the second end portion having deposited thereon a second array of attachment pads.

6. The apparatus according to claim 2, wherein the first chip, the flexible substrate, and the first and the second routing layers define a first module; the flexible substrate includes a first end portion; a second end portion; and a curved portion connecting the first and the second end portions; the first and second surfaces extending through the first end portion, the curved portion and the second end portion; the first surface in the first end portion having deposited thereon a first array of attachment pads; the second end portion having deposited thereon a second array of attachment pads, and further comprising:
a second module mounted on the first module; and
the second module having a second chip electrically having a plurality of signal and power paths electrically coupled to the second plurality of attachment pads and a plurality of ground paths electrically coupled to the ground plane.

7. The apparatus according to claim 2, wherein the second routing layer includes a plurality of ground pads electrically coupled to the first chip, a plurality of power traces electrically coupled to the first chip, and a plurality of signal traces electrically coupled to the first chip; the flexible substrate includes a first end portion; a second end portion; and a curved portion connecting the first and the second end portions; the first and second surfaces extending through the first end portion, the curved portion and the second end portion; the first surface in the first end portion having deposited thereon a first array of attachment pads; the first surface in the second end portion having deposited thereon a second array of attachment pads; a first part of the first array of attachment pads being coupled to the plurality of ground pads by a first plurality of vias extending through the first end portion and a second part of the first array of attachment pads being coupled to the plurality of signal and ground traces by a second plurality of vias extending through the first end portion.

8. An apparatus, comprising:
a first module including a first chip; a folded flexible substrate having a first and a second opposed surface and being disposed in a partially surrounding relationship with the first chip, with the first surface being disposed outwardly relative to the first chip and the second surface being disposed inwardly relative to the first chip; a first routing layer formed on the first surface; a second routing layer formed on the second surface; and a metal ground plane disposed on the first surface and forms part of the first routing layer; and
a second module including a second chip and being mounted on the first module; and second chip being electrically coupled to the first routing layer.

9. The apparatus according to claim 8, wherein the first routing layer includes a plurality of attachment pads formed on the first surface; and the ground plane is disposed in a surrounding spaced-apart relationship to the attachment pads.

10. The apparatus according to claim 8, wherein the first routing layer includes a plurality of attachment pads formed on the first surface; and the ground plane extends over substantially most of the first surface not occupied by the plurality of attachment pads and a plurality of insulating areas surrounding the attachment pads.

11. The apparatus according to claim 9, wherein the second routing layer includes a plurality of ground pads electrically coupled to the first chip, a plurality of power traces electrically coupled to the first chip, and a plurality of signal traces electrically coupled to the first chip.

12. The apparatus according to claim 9, wherein the flexible substrate includes a first end portion; a second end portion; and a curved portion connecting the first and the second end portions; the first and second surfaces extending through the first end portion, the curved portion and the second end portion; the first surface in the first end portion having deposited thereon a first array of attachment pads coupled to the first chip; and the second end portion having deposited thereon a second array of attachment pads with the second array of attachment pads and the ground plane being coupled to the second chip.

13. A system, comprising:
a printed circuit board including a bus and an integrated circuit package coupled to the bus;
the integrated circuit package including a first module and a second module mounted on the first module; the first module including a first chip, a folded flexible substrate having a first and a second opposed surface and being disposed in a partially surrounding relationship with the first chip, a first routing layer formed on the first surface, a second routing layer formed on the second surface, and a selected one of the first and second routing layers including metal ground plane; and the second module including a second chip with the second chip being electrically coupled to the first routing layer; and
the first chip comprising a processor chip and the second chip comprising a graphics controller.

14. The system according to claim 13, wherein the second module includes a third chip in the form of a memory chip.

15. The system according to claim 13, wherein the first surface is disposed outwardly relative to the first chip; the second surface is disposed inwardly relative to the first chip; and the ground plane is disposed on the first surface and forms part of the first routing layer.

16. The system according to claim 15, wherein the first routing layer includes a plurality of attachment pads formed on the first surface; and the ground plane is disposed in a surrounding spaced-apart relationship to the attachment pads.

17. The system according to claim 15, wherein the first routing layer includes a plurality of attachment pads formed on the first surface; and the ground plane extends over substantially most of the first surface not occupied by the plurality of attachment pads and a plurality of insulating areas surrounding the attachment pads.

18. The system according to claim 16, wherein the second routing layer includes a plurality of ground pads electrically coupled to the first chip, a plurality of power traces electrically coupled to the first chip, and a plurality of signal traces electrically coupled to the first chip.

19. The system according to claim 16, wherein the flexible substrate includes a first end portion; a second end portion; and a curved portion connecting the first and the second end portions; the first and second surfaces extending through the first end portion, the curved portion and the second end portion; the first surface in the first end portion having deposited thereon a first array of attachment pads coupled to the first chip; and the second end portion having deposited thereon a second array of attachment pads with the second array of attachment pads and the ground plane being coupled to the second chip.

* * * * *

UNITED STATES PATENT AND TRADEMARK OFFICE
CERTIFICATE OF CORRECTION

PATENT NO. : 7,154,175 B2  Page 1 of 1
APPLICATION NO. : 10/873817
DATED : December 26, 2006
INVENTOR(S) : Udy Shrivastava et al.

It is certified that error appears in the above-identified patent and that said Letters Patent is hereby corrected as shown below:

In the Claims:

Col. 8, line 17 [Claim 13] "...including metal ground plane: and..." should read --...including a metal ground plane; and...--.

Signed and Sealed this

Seventeenth Day of March, 2009

JOHN DOLL
*Acting Director of the United States Patent and Trademark Office*